United States Patent
Afzali-Ardakani et al.

(10) Patent No.: US 9,105,853 B2
(45) Date of Patent: *Aug. 11, 2015

(54) N-DOPANT FOR CARBON NANOTUBES AND GRAPHENE

(71) Applicant: International Business Machines Corporation, Armonk, NY (US)

(72) Inventors: Ali Afzali-Ardakani, Ossining, NY (US); Bhupesh Chandra, Jersey City, NJ (US); George Stojan Tulevski, White Plains, NY (US)

(73) Assignee: International Business Machines Corporation, Armonk, NY (US)

(*) Notice: Subject to any disclaimer, the term of this patent is extended or adjusted under 35 U.S.C. 154(b) by 34 days.

This patent is subject to a terminal disclaimer.

(21) Appl. No.: 14/051,869

(22) Filed: Oct. 11, 2013

(65) Prior Publication Data

US 2014/0038350 A1 Feb. 6, 2014

Related U.S. Application Data

(63) Continuation of application No. 13/308,974, filed on Dec. 1, 2011, now Pat. No. 8,642,432.

(51) Int. Cl.
*H01L 21/336* (2006.01)
*H01L 51/05* (2006.01)
(Continued)

(52) U.S. Cl.
CPC ............ *H01L 51/0558* (2013.01); *B82Y 10/00* (2013.01); *H01L 51/002* (2013.01);
(Continued)

(58) Field of Classification Search
CPC .......................... H01L 51/0059; H01L 21/336
See application file for complete search history.

(56) References Cited

U.S. PATENT DOCUMENTS 5,708,123 A  1/1998  Johannsen et al.
6,891,227 B2  5/2005  Appenzeller et al.
(Continued)

OTHER PUBLICATIONS

Wu et al., 4n Pi Electronics but Stable: N.N-Dihydrodiazapentacenes Semiconductors; Sep. 15, 2005.
Ma et al., Organic Thin Film Transistors Based on Stable Amorphous Ladder Tetraazapentacenes Semiconductors; Sep. 15, 2005.
(Continued)

*Primary Examiner* — Zandra Smith
*Assistant Examiner* — Andre' C Stevenson
(74) *Attorney, Agent, or Firm* — Ryan, Mason & Lewis, LLP

(57) ABSTRACT

A composition and method for forming a field effect transistor with a stable n-doped nano-component. The method includes forming a gate dielectric on a gate, forming a channel comprising a nano-component on the gate dielectric, forming a source over a first region of the nano-component, forming a drain over a second region of the nano-component to form a field effect transistor, and exposing a portion of a nano-component of a field effect transistor to dihydrotetraazapentacene, wherein dihydrotetraazapentacene is represented by the formula:

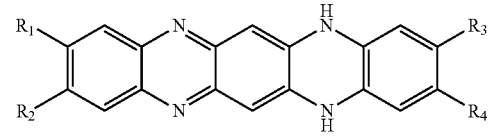

wherein each of R1, R2, R3, and R4 comprises one of hydrogen, an alkyl group of C1 to C16 carbons, an alkoxy group, an alkylthio group, a trialkylsilane group, a hydroxymethyl group, a carboxylic acid group and a carboxylic ester group.

20 Claims, 5 Drawing Sheets

(51) Int. Cl.
*B82Y 10/00* (2011.01)
*H01L 51/00* (2006.01)
*B82Y 40/00* (2011.01)

(52) U.S. Cl.
CPC .......... *H01L51/0072* (2013.01); *H01L 51/055* (2013.01); *B82Y 40/00* (2013.01); *H01L 51/0018* (2013.01); *H01L 51/0048* (2013.01); *Y10S 977/846* (2013.01); *Y10S 977/938* (2013.01)

(56) References Cited

U.S. PATENT DOCUMENTS

| | | | |
|---|---|---|---|
| 7,253,431 | B2 | 8/2007 | Afzali-Ardakani et al. |
| 7,405,129 | B2 | 7/2008 | Afzali-Ardakani et al. |
| 7,582,534 | B2 * | 9/2009 | Afzali-Ardakani et al. .. 438/287 |
| 7,754,183 | B2 | 7/2010 | Keskar et al. |
| 2004/0183070 | A1 | 9/2004 | Afzali-Ardakani et al. |
| 2006/0105523 | A1 | 5/2006 | Afzali-Ardakani et al. |
| 2009/0272967 | A1 | 11/2009 | Afzali-Ardakani et al. |
| 2010/0044230 | A1 | 2/2010 | Papadimitrakopoulos et al. |
| 2012/0052308 | A1 | 3/2012 | El-Ashry et al. |

OTHER PUBLICATIONS

Seillan et al., Efficient Synthesis of Substituted Dihydrotetraazapentacenes; Jul. 3, 2008.

Tang et al., Benzenoid and Quinonoid Nitrogen-Containing Heteropentacenes; Chem. Eur. J. 2009, 15. 3965-3969.

Liang et al., N-Type Organic Semiconductors Based on .pi.-Deficient Pentacenequinones: Synthesis, Electronic Structures, Molecular Packing, and Thin Film Transistors, Chemistry of Materials, vol. 22(23); 2010; 6438-6443.

Tang et al., N-heteroquinones: Quadruple Weak Hydrogen Bonds and N-Channel Transistors, Chemical Communications, vol. 46(17); 2010; Cambridge (UK), 2977-2979.

S.A. Jenekhe, Electroactive Ladder Polyquinoxalines. 1. Properties of the Model Compound 5, 12-dihydro-5, 12- dihydro-5, 7, 12, 14-tetraazapentacene and its complexes, Macromolecules, vol. 24, No. 1, 1991, pp. 1-10.

Klinke et al. Charge Transfer Induced Polarity Switching in Carbon Nanotube Transistor, Nano Letters, vol. 5, No. 3, 555-558 (2005).

M. Radosavljevic et al., High Performance of Potassium n-doped Carbon Nanotube Field-effect Transistors, Applied Physics Letter, vol. 84, No. 18, 2004, pp. 3693-3695.

* cited by examiner ated Dec. 1, 2011 and incorporated by reference herein.

N-DOPANT FOR CARBON NANOTUBES AND GRAPHENE

CROSS-REFERENCE TO RELATED APPLICATIONS

This application is a continuation of U.S. patent application Ser. No. 13/308,974, filed Dec. 1, 2011 and incorporated by reference herein.

FIELD OF THE INVENTION

Embodiments of the invention generally relate to electronic devices and, more particularly, to doping nano-components.

BACKGROUND OF THE INVENTION

Although progress has been made on carbon nanotube (CN) based transistors in teens of both fabrication and understanding of their performance limits, challenges exist, for example, in process-compatible doping methods for CN field effect transistors (CNFET).

For many electronic devices there is a need for both p- and n-dopant. A positive-type or p-type semiconductor is obtained by carrying out a process of doping—adding a certain type of atoms to the semiconductor to increase the number of free charge carriers. Negative-type or n-type semiconductors include dopant atoms that are capable of providing extra conduction electrons to the host material.

In the case of carbon nanotubes and graphene, existing approaches include p-dopant which are stable in air and convert the nanotubes completely to p-doped materials. A p-CNFET can be converted to an ambipolar or n-CNFET via vacuum pumping. Although n-CNFETs can be formed by alkali metals or gas-phase doping, a controlled environment is required to prevent dopant desorption, because upon exposure to air, these devices quickly degrade and may become non-operational.

Accordingly, there is a need for an n-dopant that produces stable n-doped materials.

SUMMARY OF THE INVENTION

In one aspect of the invention, a method for forming a field effect transistor with a stable n-doped nano-component is provided. The method includes the steps of forming a gate dielectric on a gate, forming a channel comprising a nano-component on the gate dielectric, forming a source over a first region of the nano-component, forming a drain over a second region of the nano-component to form a field effect transistor, and exposing a portion of a nano-component of a field effect transistor to dihydrotetraazapentacene, wherein dihydrotetraazapentacene is represented by the formula:

wherein each of R1, R2, R3, and R4 comprises one of hydrogen, an alkyl group of C1 to C16 carbons, an alkoxy group, an alkylthio group, a trialkylsilane group, a hydroxymethyl group, a carboxylic acid group and a carboxylic ester group.

Another aspect of the invention includes a method for producing a stable n-doped nano-component of a field effect transistor, which includes exposing a portion of a nano-component of a field effect transistor to dihydrotetraazapentacene, wherein dihydrotetraazapentacene is represented by the formula:

wherein each of R1, R2, R3, and R4 comprises one of hydrogen, an alkyl group of C1 to C16 carbons, an alkoxy group, an alkylthio group, a trialkylsilane group, a hydroxymethyl group, a carboxylic acid group and a carboxylic ester group.

These and other objects, features and advantages of the present invention will become apparent from the following detailed description of illustrative embodiments thereof, which is to be read in connection with the accompanying drawings.

DETAILED DESCRIPTION OF EMBODIMENTS

Figure 1:
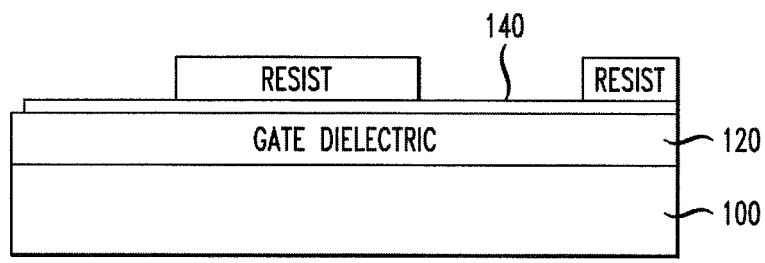
FIG. 1 illustrates a step in forming a field effect transistor (FET), according to an embodiment of the present invention.

An aspect of the invention includes an n-dopant for carbon nanotubes (CN) and graphene, as well as techniques for doping nano-components. At least one embodiment of the invention includes a nitrogen-containing condensed aromatic compound as n-dopant for both carbon nanotubes and graphene. In contrast to existing approaches and materials, an aspect of the invention includes an n-dopant that produces stable n-doped materials.

Doping is preferably conducted in solution phase, although gas phase doping is also feasible. For solution processes, organic solvents such as dimethylsulfoxide, N,N-dimethylformamide, dichlorobenzene, dichloromethane, ethanol, acetonitrile, chloroform, methanol, butanol, among others, are suitable. N-doping can be accomplished via charge transfer from the dopants to the nano-components, for example, interaction of the lone electron pairs of doping molecules with the quantum confined orbitals of semiconductor nanowires and nanocrystals which affects the concentration of carriers involved in charge transport.

With solution phase doping, for example, nano-components can be doped before and/or after their integration into a circuit on a chip. Nano-components can also be doped locally on the chip using techniques such as inkjet printing. The doping level along a nanowire, nanotube or a nanocrystal film can be varied by masking certain portions (for example, contacts) of the nano-component with resist and doping only the exposed portions. For device applications, nanowires can be protected from damage by implementing the doping at an appropriate stage during process integration. For example, undoped, poorly conductive nanowires can first be aligned and assembled on a chip by applying external electric fields. The low conductivity protects the nanowires from burning during the alignment step. After alignment and integration into the chip, the conductivity of nanowires can then be significantly enhanced by solution-phase doping to the desired level.

Nanotubes, for example, carbon nanotubes, can be doped either in bulk by suspension of the nanotubes in a dopant solution, with or without heating; or immersing in the dopant solution a substrate supporting the nanotubes. Although carbon nanotubes are used as examples in the following discussions, doping methods of this invention can also be applied to other semiconducting nanotubes, which may include, for example, Si, Ge, GaAs, GaP, GaSb, InN, InP, InAs, InSb, CdS, CdSe, CdTe, HgS, HgSe, HgTe, GeS, GeSe, GeTe, PbO, PbS, PbSe, PbTe, and combinations thereof.

Interaction of carbon nanotubes with the dopants, for example, via charge transfer, results in the formation of charged (radical cation) moieties close to the nanotubes. Bulk doping can be achieved by stirring a suspension of the carbon nanotubes in a dopant solution at a preferred temperature from about 20 degrees Celsius (C.) to about 50 degrees C., with a dopant concentration preferably from about 1 millimolar (mmolar) to about 5 mmolar. Depending on the specific dopants and solvents, however, concentration ranging from about 0.0001 M to about 10 M may be used with temperatures from about 0 degrees C. to about 50 degrees C.

In general, the extent of doping depends on the concentration and temperature of the doping medium, and process parameters are selected according to the specific nano-component, dopant and solvent combination, as well as specific application needs or desired device characteristics.

Device doping, that is, doping the nanotube after it has been incorporated as part of a device structure of substrate, can be achieved by exposing the device or substrate with the nanotube to a dopant solution. By appropriately masking the nanotube, selective doping of portions of the nanotube can be achieved to produce desired doping profiles along the nanotube. As noted above, dopant concentration is preferably in the range of about 0.001 M to about 10 M, more preferably from about 1 mmolar to about 5 mmolar, and most preferably, from about 1 mmolar to about 3 mmolar, with the solution temperature preferably from about 10 degrees C. to about 50 degrees C., and more preferably, from about 20 degrees C. to about 50 degrees C. With device doping, the choice of process conditions also depends on compatibility with other materials present on the device or substrate. For example, while lower dopant concentrations tend to be less effective in general, too high a concentration of certain dopants may result in potential corrosion issues. In one embodiment, the doping is done under a $N_2$ atmosphere without stirring or agitation of the solution. However, agitation of the solution can be acceptable as long as it does not cause damage to the device.

As detailed below, FIGS. 1-4 illustrate steps of a method for forming a field effect transistor (FET). Accordingly, FIG. 1 illustrates a step in forming a field effect transistor (FET), according to an embodiment of the present invention. A gate dielectric 120 such as silicon dioxide, or oxynitride, or a high K material layer is deposited on gate 100, which is generally a doped silicon substrate. In an embodiment of the invention, the silicon substrate is degenerately doped. The gate dielectric can have a thickness, for example, from about 1 to about 100 nanometers (nm). A nano-component 140, for example, carbon nanotube, is deposited on gate dielectric 120 by spin-coating. A resist pattern is then formed on the carbon nanotube 140 by conventional lithographic techniques. For example, a resist layer can be deposited over the carbon nanotube 140 and patterned by using e-beam lithography or photolithography. With a positive resist, regions of the resist layer exposed to the e-beam or lithographic radiation are removed by using a developer, resulting in a structure with resist pattern shown in FIG. 1.

The resist pattern formed on the carbon nanotube may have one or multiple separations from about 10 nm to about 500 nm when e-beam lithography is used, and from about 500 nm to about 10 µm with photolithography. The multiple separations correspond to the line and space separations resulting from the respective lithographic techniques, and represent separations between adjacent top gates. The availability of multiple top gates provides flexibility of individual control for different logic applications, for example, AND, OR, NOR operations.

Figure 2:
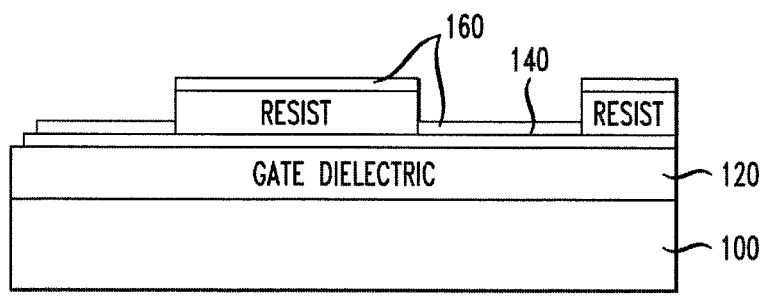
FIG. 2 illustrates a step in forming a field effect transistor (FET), according to an embodiment of the present invention.

As shown in FIG. 2, a metal 160, having a thickness ranging from about 15 nm to about 50 nm, is deposited on the resist pattern and over portions of the carbon nanotube 140. The metal can be Pd, Ti, W, Au, Co, Pt, or alloys thereof, or a metallic nanotube. If a metallic nanotube is used, the metal 160 may include one or more metallic nanotubes. Other metals or alloys of Pd, Ti, W, Au, Co, Pt, can be deposited by e-beam or thermal evaporation under vacuum, while metallic nanotubes can be deposited with solution phase techniques such as spin coating.

Following deposition of the metal, the structure can be immersed in acetone or N-methylpyrrolidone (NMP) for resist liftoff, a process that removes the lithographically patterned resist and the metal deposited on top by soaking the sample in solvents such as acetone or NMP. For example, such solvents can also be referred to generally as resist liftoff components.

Figure 3:
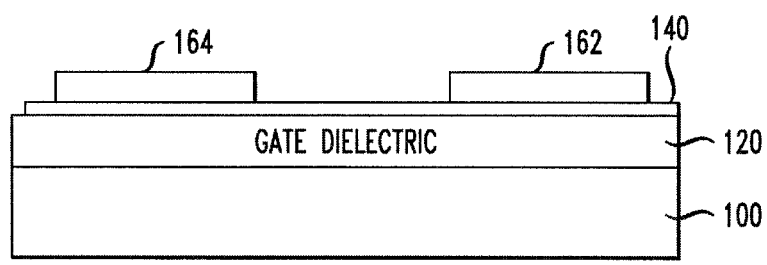
FIG. 3 illustrates a step in forming a field effect transistor (FET), according to an embodiment of the present invention.
Figure 4:
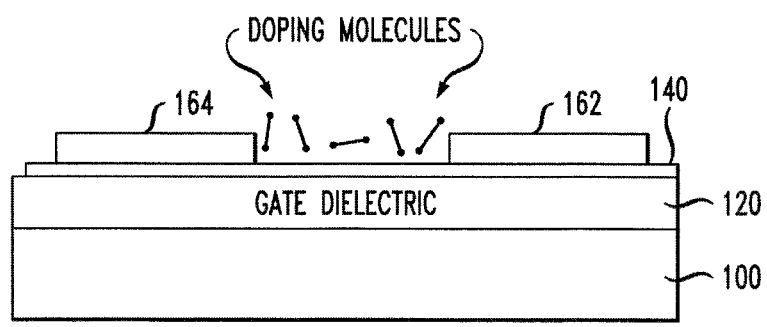
FIG. 4 illustrates a step in forming a field effect transistor (FET), according to an embodiment of the present invention.

As depicted in FIG. 3, the metal portions 162 and 164 remaining on the carbon nanotube 140 form the FET source and drain. In this embodiment, the source and drains are formed over a first and a second region, respectively, of the carbon nanotube 140, or more generally, of the nano-component 140. Following resist liftoff, the structure in FIG. 3 with the carbon nanotube 140 is immersed in an organic solution comprising a suitable dopant as described herein in connection with an embodiment of the invention. FIG. 4 illustrates the doping molecules bonding to the carbon nanotube 140. The doped portion of the carbon nanotube 140 (between the metal source and drain) acts as the channel of the FET.

Figure 5:
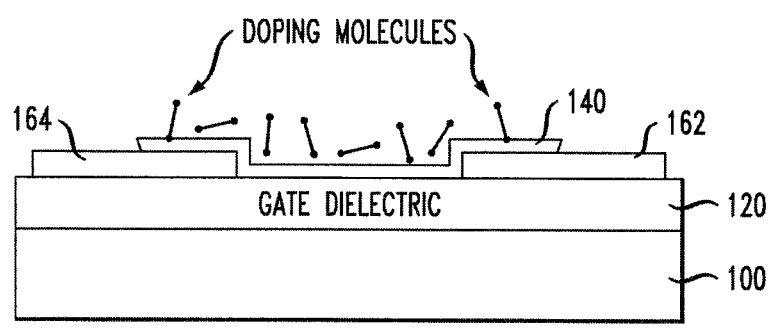
FIG. 5 illustrates another embodiment of forming a carbon nanotube FET (CNFET), according to an embodiment of the present invention.

FIG. 5 illustrates another embodiment of forming a carbon nanotube FET, or more generally, a FET with a channel comprising a nano-component such as other semiconducting nanotubes, nanowires or nanocrystal films. After the formation of gate dielectric 120 on substrate 100, metal portions 162 and 164 are formed on gate dielectric 120 using a resist liftoff process (not shown) similar to that described for FIGS. 1-4. Metal portions 162 and 164, each having a thickness from about 15 nm to about 300 nm, form the FET source and drain. Metals such as Pd, Ti, W, Au, Co and Pt, and alloys thereof, or one or more metallic nanotubes can be used for the metal portions 162, 164. A carbon nanotube 140, or more generally, a nano-component, is then disposed, for example, by spin-coating, over the gate dielectric 120 and the metal portions 162 and 164. Blanket doping of the carbon nanotube 140 is achieved by immersing the structure in an organic solution comprising a suitable dopant. The dopant molecules bond to the carbon nanotube, for example, via charge transfer interaction with the nitrogen of a dopant (for example, such as detailed herein) donating a lone pair of electrons to the carbon nanotube. In this illustration, the portion of the carbon nanotube 140 in contact with the gate dielectric 120 forms the channel of the FET.

Alternatively, the carbon nanotube 140 can be selectively doped through a patterned resist (not shown) that is formed over the carbon nanotube 140. The patterned resist may be formed, for example, by depositing a suitable resist material over the carbon nanotube 140 and patterning using conventional lithographic techniques. Hydrogensilsesquioxanes (HSQ), a dielectric that can be used as a negative resist, may be used for this purpose.

Figure 6:
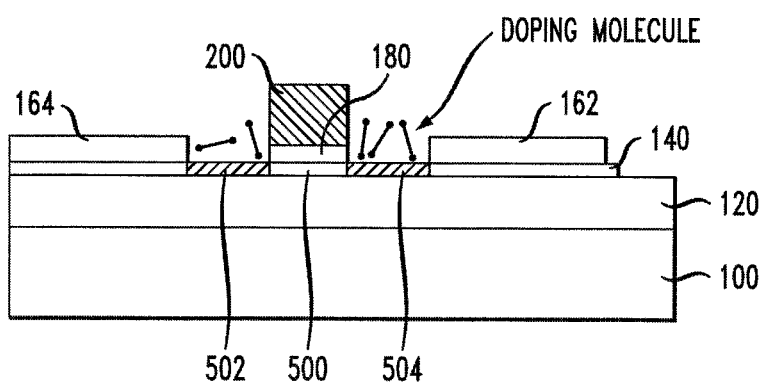
FIG. 6 illustrates an embodiment of a dual-gate CNFET, according to an embodiment of the present invention.

FIG. 6 illustrates an embodiment of a dual-gate carbon nanotube FET, or more generally, a FET with a channel comprising a nano-component such as other semiconducting nanotubes, nanowires or nanocrystal films. After the gate dielectric 120 is formed over the substrate 100, which acts as a first gate (also referred to as a bottom or back gate), a carbon nanotube, or more generally, a nano-component 140 is deposited on gate dielectric 120. Metal portions 162, 164 are formed over the carbon nanotube 140 using a resist liftoff technique such as that described in connection with FIGS. 1-4. After metal portions 162, 164 are formed (acting as source and drain of the FET), the structure containing the carbon nanotube 140 and metal portions 162, 164 is covered with a dielectric layer 180, which can be a low temperature oxide (LTO) or a chemical vapor deposition (CVD) high dielectric material such as hafnium dioxide.

A second gate 200 (also referred to as top or front gate), which can include a metal or highly doped polysilicon, is formed over the dielectric layer 180, for example, by first depositing a gate material over dielectric layer 180 and then patterning to form top gate 200. With the top gate 200 acting as an etch mask, the dielectric layer 180 is etched such that only the portion underneath the top gate 200 remains, as shown in FIG. 6. As an example, a dilute hydrofluoric (HF) acid such as 100:1 HF can be used as an etchant for LTO.

Additionally, the device is immersed in a dopant solution to achieve partial doping of the carbon nanotube 140. In this case, the channel includes both the gated undoped region 500 and the two doped regions 502 and 504. The doped regions 502 and 504 act like the "extensions" of a CMOS BET, resulting in reduced contact barrier and improvements in drive current and transistor switching. The device can be operated by either the top gate 200 or the bottom gate 100, or both. In logic applications, it is desirable to operate a FET with the top gate configuration for satisfactory alternating current (AC) performance.

Figure 7:
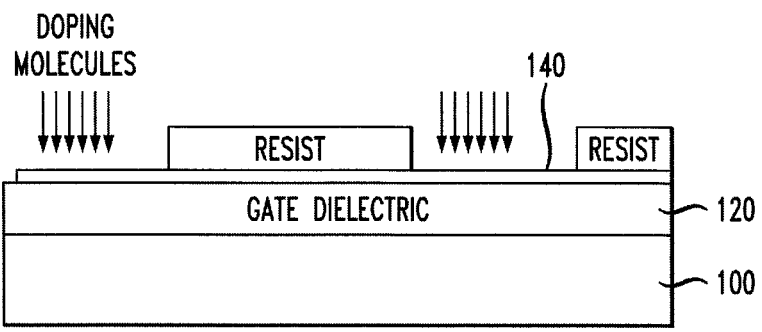
FIG. 7 illustrates a step in another embodiment of forming a CNFET, according to an embodiment of the present invention.
Figure 8:
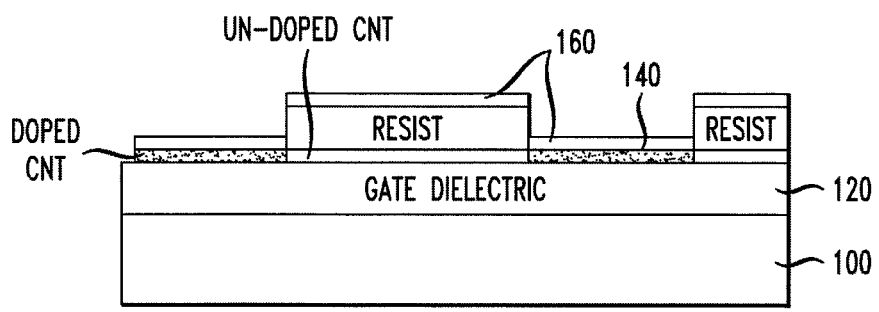
FIG. 8 illustrates a step in another embodiment of forming a CNFET, according to an embodiment of the present invention.
Figure 9:
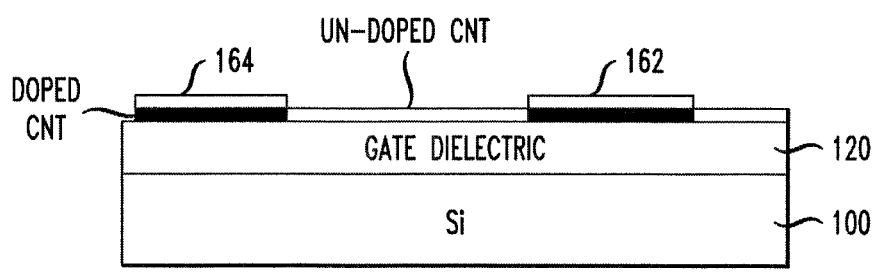
FIG. 9 illustrates a step in another embodiment of forming a CNFET, according to an embodiment of the present invention.

As detailed below, FIGS. 7-9 illustrate steps in another embodiment of forming a carbon nanotube FET, or more generally, a BET with a channel comprising a nano-component such as other semiconducting nanotubes, nanowires or nanocrystal films. After the carbon nanotube or nano-component 140 is deposited on gate dielectric 120, which has previously been formed over substrate 100, a patterned resist is formed on the carbon nanotube 140 using conventional lithographic techniques such as e-beam or photolithography.

The structure (shown in FIG. 7) containing the patterned resist and carbon nanotube 140 is immersed in an organic solution including a suitable dopant (as detailed herein). The doping molecules bond to the exposed portions of the carbon nanotube 140. Following doping of the nanotube 140, a metal layer 160 having a thickness ranging from about 15 nm to about 50 nm is deposited over the patterned resist and the doped carbon nanotube 140. As previously described, Pd, Ti, W, Au, Co, Pt, or alloys thereof, or one or more metallic nanotubes can be used for metal 160. Metallic nanotubes can be deposited using solution phase techniques such as spin coating, while electron beam or vacuum evaporation can be used for deposition of other metals or alloys.

Following deposition of the metal, the structure shown in FIG. 8 is immersed in acetone or N-Methyl-2-pyrrolidone (NMP) for resist liftoff. As shown in FIG. 9, metal portions 162, 164 remaining after resist liftoff form the source and drain of the FET. The process of FIGS. 7-9 generates a significant doping profile difference along the channel of the carbon nanotube transistor. Note that in this case, the undoped portion (portion 500 in FIG. 6, for example) of the carbon nanotube 140 forms the channel of the FET.

To complete the formation of the FET devices illustrated in FIGS. 1-9, passivation can be performed by covering the respective devices with a spin-on organic material like poly (methyl methacrylate) (PMMA) or hydrogensilsesquioxanes (HSQ)—a low K dielectric layer, or by depositing a low temperature dielectric film such as silicon dioxide. Further processing of the device is accomplished via metallization for the back-end of the line.

Figure 10:
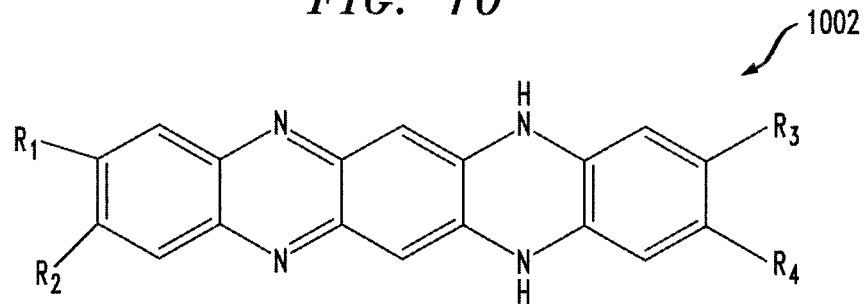
FIG. 10 is a diagram illustrating dihydrotetraazapentacene, according to an embodiment of the present invention.

In an aspect of the present invention, the n-dopant material is dihydrotetraazapentacene, as depicted in FIG. 10, with or without substituents on the end rings. These materials can be synthesized by a simple one-step reaction of heating 1,2-pheneylendiamine with 2,5-dihydroxybenzoquinone in polyphosphoric acid, as described, for example, by Samson A. Jenekhe (Macromolecules, 24, 1, 1991) and are effective reducing agents which can donate electrons to carbon nanotubes and form charge transfer complex, and thereby n-doping the carbon materials.

FIG. 10 is a diagram 1002 illustrating the chemical structure dihydrotetraazapentacene, according to an embodiment of the present invention. As detailed herein, in at least one embodiment of the invention, in the dihydrotetraazapentacene chemical structure, at least one of R1, R2, R3, and R4 is hydrogen (the parent compound).

Additionally, in at least one embodiment of the invention, in the dihydrotetraazapentacene chemical structure, at least one of R1, R2, R3, and R4 is an alkyl group of C1 to C16 carbons, alkoxy, alkylthio, trialkylsilane, hydroxymethyl, carboxylic acid or carboxylic ester. As used herein and generally understood, in a chemical structural formula, a substituent (for example, an organic substituent) can be written as R (or R1, R2, etc.), which can be a generic placeholder.

Also, dihydrotetraazapentacene has very low oxidation potentials and can easily lose two electrons to form much more stable aromatic form of tetraazapentacene. In this process, dihydrotetraazapentacene donate one or two electrons to carbon nanotubes or any other electron accepting compounds and form charge transfer complex.

In at least one embodiment of the invention, carbon nanotubes (individually or as thin film) are treated with a dilute solution of the above material (that is, dihydrotetraazapentacene) in an organic solvents (for example, dimethyl sulfoxide (DMSO), Dimethylformamide (DMF), N-methylpyrolidine, and a combination thereof) and the excess dopant is washed away with a solvent to produce a cleaned n-doped nano-component. A monolayer of the dopant will react with carbon nanotubes (or graphene) and form n-doped materials which are far more stable than using alkali metals or hydrazine.

Figure 11:
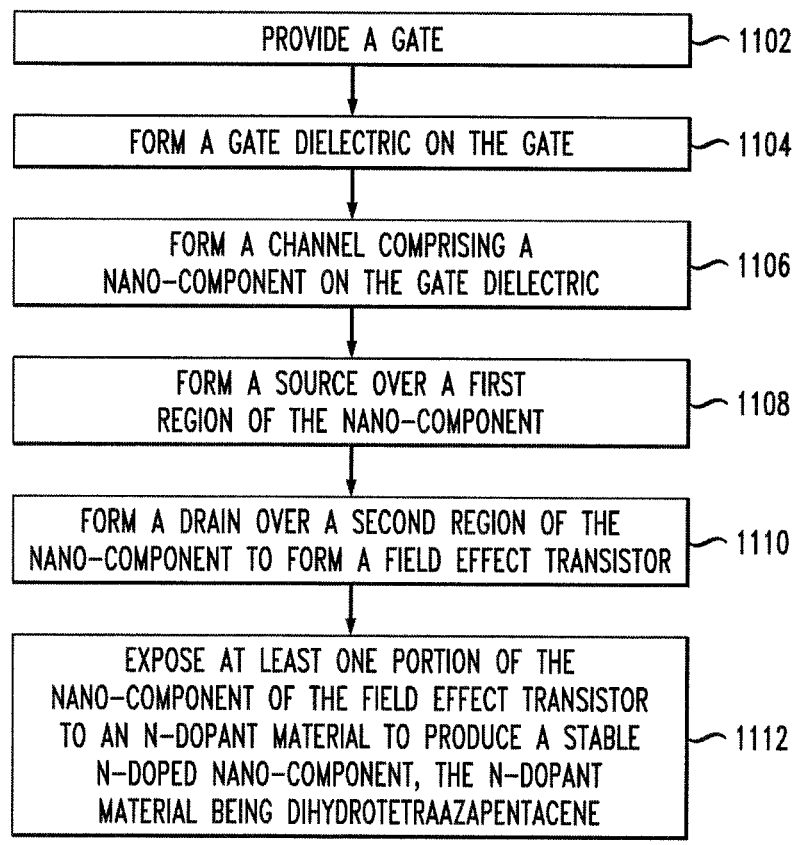
FIG. 11 is a flow diagram illustrating techniques for forming a field effect transistor with a stable n-doped nano-component, according to an embodiment of the present invention.

FIG. 11 is a flow diagram illustrating techniques for forming a field effect transistor with a stable n-doped nano-component, according to an embodiment of the present invention. Step 1102 includes providing a gate. Step 1104 includes forming a gate dielectric on the gate. Step 1106 includes forming a channel comprising a nano-component on the gate dielectric. Step 1108 includes forming a source over a first region of the nano-component. Step 1110 includes forming a drain over a second region of the nano-component to form a field effect transistor. Step 1112 includes exposing a portion of a nano-component of the field effect transistor to an n-dopant material to produce a stable n-doped nano-component, the n-dopant material being dihydrotetraazapentacene. As detailed herein, exposing the portion of the nano-component includes exposing a portion of a nano-component of a field effect transistor to dihydrotetraazapentacene to produce a stable n-doped nano-component, wherein dihydrotetraazapentacene is represented by the formula:

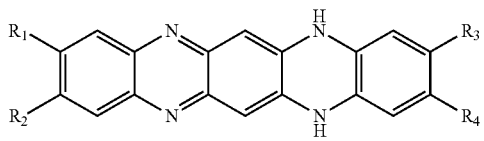

wherein each of R1, R2, R3, and R4 comprises one of hydrogen, an alkyl group of C1 to C16 carbons, an alkoxy group, an alkylthio group, a trialkylsilane group, a hydroxymethyl group, a carboxylic acid group and a carboxylic ester group.

In an example embodiment of the invention, at least one of R1, R2, R3, and R4 is hydrogen. Additionally, in another example, embodiment of the invention, at least one of R1, R2, R3, and R4 is an alkyl group of C1 to C16 carbons.

The techniques depicted in FIG. 11 additionally include providing a dielectric layer on the nano-component, providing a gate material layer on the dielectric layer, patterning the gate material layer to form a top gate, and patterning the dielectric layer by using the top gate as a mask.

As detailed herein, dihydrotetraazapentacene can include or not include a substituent on at least one end ring in its chemical structure. Also, the nano-component can be one of a carbon nanotube, a semiconductor nanotube, a semiconductor nanocrystal (for example, a PbSe nanocrystal film) and a semiconductor nanowire (for example, a PbSe nanowire). Additionally, in accordance with an aspect of the invention, a dopant applicable to nanotubes will also be effective in doping graphene. Further, by way of example, the nano-component can be one of semiconductor nanotube, nanocrystal and nanowire including elements of Groups III, IV, V and VI. Also, in another aspect of the invention, the nano-component includes at least one of Si, Ge, GaAs, GaP, GaSb, InN, InP, InAs, InSb, CdS, CdSe, CdTe, HgS, HgSe, HgTe, GeS, GeSe, GeTe, PbO, PbS, PbSe, and PbTe.

As also described herein, exposing at least one portion of the nano-component to an n-dopant material (that is, dihydrotetraazapentacene) includes applying a suspension of the nano-component in a solution containing the n-dopant material to the at least one portion of the nano-component. Such a solution can have an n-dopant material (dihydrotetraazapentacene) concentration between about 0.0001 M to about 0.05 M and a temperature between about 20 degrees C. to about 100 degrees C. For example, in an embodiment of the invention, the solution can have an n-dopant material concentration between about 0.1 moles (M) to about 10 M and a temperature between about 20 degrees C. to about 50 degrees C.

Further, solution can include dimethylsulfoxide, and can be maintained, for example, at a temperature between about 10 degrees C. to about 100 degrees C. For example, in an embodiment of the invention, the solution can be maintained at a temperature between about 10 degrees C. to about 50 degrees C.

Forming a source over a first region of the nano-component and forming a drain over a second region of the nano-component include the steps of applying a resist layer over the nano-component, patterning the resist layer, depositing a metal layer over the patterned resist layer, and exposing the patterned resist layer to a resist liftoff component to remove the patterned resist layer and a portion of the metal layer, thereby leaving other portions of the metal layer to form the drain and the source.

Further, as detailed herein, the at least one portion of the nano-component exposed to the n-dopant material (that is, dihydrotetraazapentacene) can be between the first region and the second region of the nano-component. In another embodiment of the invention, the at least one portion of the nano-component exposed to the n-dopant material can be the first region and the second region of the nano-component.

In general, depending on the nanocrystal size, shape and size distribution, and preparation conditions, the resulting semiconductor nanocrystal film can have different morphologies due to differences in packing density, packing symmetry and packing disorder. Also, the term nanocrystal film, as used herein, is meant to cover any resulting aggregates of nanocrystals, regardless of their specific packing configurations.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:
1. A method comprising:
    exposing a portion of a nano-component of a field effect transistor to dihydrotetraazapentacene, wherein dihydrotetraazapentacene is represented by the formula:

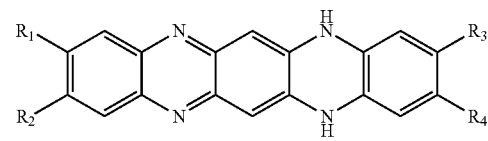

wherein each of R1, R2, R3, and R4 comprises one of hydrogen, an alkyl group of C1 to C16 carbons, an alkoxy group, an alkylthio group, a trialkylsilane group, a hydroxymethyl group, a carboxylic acid group and a carboxylic ester group.
2. The method of claim 1, wherein said exposing comprises treating the portion of the nano-component with a solution of dihydrotetraazapentacene in an organic solvent.

3. The method of claim 2, wherein said exposing comprises removing excess dihydrotetraazapentacene with an organic solvent to produce a cleaned n-doped nano-component.

4. The method of claim 2, wherein the organic solvent comprises one of dimethyl sulfoxide (DMSO), dimethylformamide (DMF), N-methylpyrolidine, and a combination thereof.

5. The method of claim 1, wherein at least one of R1, R2, R3, and R4 is hydrogen.

6. The method of claim 1, wherein at least one of R1, R2, R3, and R4 is an alkyl group of C1 to C16 carbons.

7. A method comprising:
forming a gate dielectric on a gate;
forming a channel comprising a nano-component on the gate dielectric;
forming a source over a first region of the nano-component;
forming a drain over a second region of the nano-component to form a field effect transistor; and
exposing a portion of a nano-component of a field effect transistor to dihydrotetraazapentacene, wherein dihydrotetraazapentacene is represented by the formula:

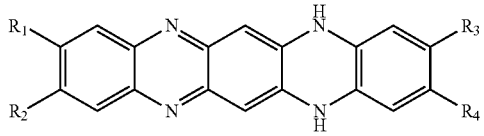

wherein each of R1, R2, R3, and R4 comprises one of hydrogen, an alkyl group of C1 to C16 carbons, an alkoxy group, an alkylthio group, a trialkylsilane group, a hydroxymethyl group, a carboxylic acid group and a carboxylic ester group.

8. The method of claim 7, further comprising:
providing a dielectric layer on the nano-component;
providing a gate material layer on the dielectric layer;
patterning the gate material layer to form a top gate; and
patterning the dielectric layer by using the top gate as a mask.

9. The method of claim 7, wherein the nano-component is a carbon nanotube.

10. The method of claim 7, wherein the nano-component is a semiconductor nanotube.

11. The method of claim 7, wherein the nano-component is one of a semiconductor nanocrystal and a semiconductor nanowire.

12. The method of claim 7, wherein the nano-component comprises elements of Groups III, IV, V and VI.

13. The method of claim 12, wherein the nano-component comprises at least one of Si, Ge, GaAs, GaP, GaSb, InN, InP, InAs, InSb, CdS, CdSe, CdTe, HgS, HgSe, HgTe, GeS, GeSe, GeTe, PbO, PbS, PbSe, and PbTe.

14. The method of claim 7, wherein said exposing comprises applying a suspension of the nano-component in a solution containing dihydrotetraazapentacene to the portion of the nano-component.

15. The method of claim 14, wherein the solution has a dihydrotetraazapentacene concentration between about 0.0001 M and about 0.05 M.

16. The method of claim 14, wherein the solution has a temperature between about 20 degrees C. to about 100 degrees C.

17. The method of claim 14, wherein the solution comprises dimethylsulfoxide.

18. The method of claim 7, wherein the steps of forming a source over a first region of the nano-component and forming a drain over a second region of the nano-component comprise the steps of:
applying a resist layer over the nano-component;
patterning the resist layer;
depositing a metal layer over the patterned resist layer; and
exposing the patterned resist layer to a resist liftoff component to remove the patterned resist layer and a portion of the metal layer, thereby leaving other portions of the metal layer to form the drain and the source.

19. The method of claim 7, wherein the portion of the nano-component exposed to dihydrotetraazapentacene is between the first region and the second region of the nano-component.

20. The method of claim 7, wherein the portion of the nano-component exposed to dihydrotetraazapentacene comprises the first region and the second region of the nano-component.

* * * * *